United States Patent
Gottwald et al.

(10) Patent No.: US 9,203,211 B2
(45) Date of Patent: Dec. 1, 2015

(54) OPTICAL NETWORK COMPONENT AND METHOD FOR PROCESSING DATA IN AN OPTICAL NETWORK

(75) Inventors: Erich Gottwald, Holzkirchen (DE); Harald Rohde, Munich (DE)

(73) Assignee: Xieon Networks S.a.r.l., Luxembourg (LU)

( * ) Notice: Subject to any disclaimer, the term of this patent is extended or adjusted under 35 U.S.C. 154(b) by 246 days.

(21) Appl. No.: 13/996,354

(22) PCT Filed: Dec. 22, 2010

(86) PCT No.: PCT/EP2010/070500
§ 371 (c)(1),
(2), (4) Date: Sep. 10, 2013

(87) PCT Pub. No.: WO2012/084027
PCT Pub. Date: Jun. 28, 2012

(65) Prior Publication Data
US 2014/0002880 A1    Jan. 2, 2014

(51) Int. Cl.
*H01S 5/00* (2006.01)
*H01S 5/50* (2006.01)
*H04B 10/516* (2013.01)
*H04B 10/548* (2013.01)
*G02B 6/35* (2006.01)

(52) U.S. Cl.
CPC ............ *H01S 5/0085* (2013.01); *H01S 5/0064* (2013.01); *H04B 10/516* (2013.01); *H04B 10/548* (2013.01); *H01S 5/50* (2013.01)

(58) Field of Classification Search
CPC ........ H01S 5/0085; H01S 5/0064; H01S 5/50
See application file for complete search history.

(56) References Cited

U.S. PATENT DOCUMENTS

| 6,287,401 | B1 * | 9/2001 | Anderson et al. | 156/64 |
| 2006/0050368 | A1 * | 3/2006 | Chung et al. | 359/344 |
| 2009/0080477 | A1 * | 3/2009 | Murison et al. | 372/25 |
| 2009/0296759 | A1 * | 12/2009 | Starodoumov | 372/25 |
| 2010/0142962 | A1 * | 6/2010 | Poustie et al. | 398/91 |

FOREIGN PATENT DOCUMENTS

WO    2012/084027 A1    6/2012

OTHER PUBLICATIONS

Astar, W. et al., "10 Gbit/s RZ-OOK to BPSK format conversion by cross-phase modulation in single semiconductor optical amplifier," Electronic Letters, vol. 42(25):1472-1474 (2006).
Durhuus, Terji et al., "All-Optical Wavelength Conversion by Semiconductor Optical Amplifiers," Journal of Lightwave Technology, vol. 14(6):942-954 (1996).

(Continued)

*Primary Examiner* — Eric Bolda
(74) *Attorney, Agent, or Firm* — Nelson Mullins Riley & Scarborough LLP

(57) ABSTRACT

An optical network component is provided comprising a semiconductor optical amplifier with an input and an output, wherein the input is connected to a light source, wherein the output is connected to an amplitude modulator, wherein the semiconductor optical amplifier converts an amplitude modulated signal from the amplitude modulator to a phase modulated signal and provides the phase modulated signal at its output. Also, a transmitter comprising at least one such optical network component is suggested.

21 Claims, 2 Drawing Sheets

(56) References Cited

OTHER PUBLICATIONS

Elmirghani, Jaafar M.H. et al., "All-Optical Wavelength Conversion: Technologies and Applications in DWDM Networks," IEEE Communications Magazine, vol. 38(3):86-92 (2000).

Jiang, Huan et al., "All-Optical NRZ-OOK to BPSK Format Conversion in an SOA-Based Nonlinear Polarization Switch," IEEE Photonics Technology Letters, vol. 19(24):1985-1987 (2007).

Nizam, M.H.M. et al., "Waspnet—A Wavelength Switched Photonic Network for Telecommunication Transport," IEEE Colloquium on Multiwavelength Optical Networks: Devices, Systems and Network Implementations, pp. 3/1-3/6 (1998).

Pleumeekers, J.L. et al., "All-Optical Wavelength Conversion and Broadcasting to Eight Separate Channels by a Single Semiconductor Optical Amplifier Delay Interferometer," OFC 2002, Optical Fiber communication Conference and Exhibit, pp. 596-597 (2002).

Thevenaz, Luc et al., "Slow-Light: Fascinating physics or potential applications? Wideband delays generated in an all-optical tunable delay line, preserving signal wavelength and bandwidth," C.R. Physique, vol. 10:1008-1013 (2009).

International Preliminary Report on Patentability and Written Opinion for Application No. PCT/EP2010/070500, 9 pages, dated Jun. 25, 2013.

International Search Report and Written Opinion for Application No. PCT/EP2010/070500, 13 pages, dated Sep. 2, 2011.

* cited by examiner

OPTICAL NETWORK COMPONENT AND METHOD FOR PROCESSING DATA IN AN OPTICAL NETWORK

RELATED APPLICATIONS

This application is a 35 U.S.C. 371 national stage filing of International Application No. PCT/EP2011/070500, filed on Dec. 22, 2010. The contents of the aforementioned application is hereby incorporated by reference.

The invention relates to an optical network component and to a method for processing data in an optical network. Also, a transmitter comprising at least one such optical network component is suggested.

Optical transmitters, in particular coherent data optical transmitters, with phase modulation are known.

[Hsiao-Yun Yu; Mahgerefteh, D.; Cho, P. S.; Goldhar, J.: Optimization of the frequency response of a semiconductor optical amplifier wavelength converter using a fiber Bragg grating, Journal of Lightwave Technology (1999), vol. 17, issue 2, p. 308-315, JLTEDG ISSN 0733-8724] discloses a cross-gain modulation in a semiconductor optical amplifier (SOA) for an all-optical wavelength conversion. An experimental setup is shown for characterization of a modulated frequency response of a SOA/fiber-grating wavelength converter. A modulated optical signal with a predetermined level fed to a SOA results in a phase modulation provided by the SOA. Hence, the amplitude modulation conveyed to the SOA's input provides a phase modulation at the SOA's output.

In other words, the SOA does a conversion from an amplitude modulated signal into a phase modulated signal.

Hence, at least one (e.g., tunable) single mode laser can feed a light beam to an amplitude modulator, e.g., an electro absorption modulator (EAM), and the amplitude modulated output is further conveyed to an SOA which serves as an amplitude to phase modulation converter.

However this scenario bears the disadvantage that the phase modulated signal provided by the SOA still contains a residual amplitude modulation portion.

The problem to be solved is to overcome this disadvantage and to provide a solution to generate an amplified phase modulated signal in particular utilizing low-cost components.

This problem is solved according to the features of the independent claims. Further embodiments result from the depending claims.

In order to overcome this problem, an optical network component is provided
 comprising a semiconductor optical amplifier with an input and an output,
 wherein the input is connected to a light source,
 wherein the output is connected to an amplitude modulator,
 wherein the semiconductor optical amplifier converts an amplitude modulated signal from the amplitude modulator to a phase modulated signal and provides the phase modulated signal at its output.

It is noted that the amplitude modulated and the semiconductor optical amplifier can be supplied by the same light source. It is also noted that the output of the amplitude modulator can convey a light beam in opposite direction to the output of the semiconductor optical amplifier (i.e. the light beam to the semiconductor optical amplifier is conveyed from the light source to its input).

It is in particular an embodiment that an input of the amplitude modulator is connected to the light source.

This solution allows for an efficient conversion of an amplitude modulated signal into a phase modulated signal and suppresses the amplitude modulated portion in this phase modulated signal. This concept does not require a chirp-free modulator and may be utilized with commonly available and non expensive parts. Also, only a single light source suffices and the semiconductor optical amplifier provides two functionalities, i.e. an amplification of the optical signal as well as a conversion from the amplitude into the phase modulated signal.

In an embodiment, the optical network element comprises the light source.

Hence, the light source (in particular several light sources) may be implemented or arranged within the optical network component.

In another embodiment, the light source comprises a laser, in particular at least one laser diode.

In a further embodiment, the light source comprises an isolator.

Instead of the isolator, a combination of a quarter wave plate and a polarizer can be used.

In a next embodiment, the optical network element comprises the amplitude modulator.

Hence, the amplitude modulator can be an integral part of the optical network component.

It is also an embodiment that the amplitude modulator is an electro absorption modulator (EAM), in particular a reflective electro absorption modulator (REAM).

Pursuant to another embodiment,
 the light source is connected via a splitter to the input of the semiconductor optical amplifier and to the amplitude modulator,
 an output of the amplitude modulator is connected via a circulator to the output of the semiconductor optical amplifier,
 the output of the semiconductor optical amplifier is connected to an optical fiber via said circulator.

Hence the semiconductor optical amplifier may convey the phase modulated signal with the suppressed amplitude modulated portion via the circulator to the optical fiber, in particular to a receiver.

According to an embodiment,
 the light source is connected to the input of the semiconductor optical amplifier,
 the output of the semiconductor optical amplifier is connected via a splitter to the amplitude modulator,
 the output of the semiconductor optical amplifier is connected via said splitter to an optical fiber.

In this exemplary scenario, the semiconductor optical amplifier may convey the phase modulated signal with the suppressed amplitude modulated portion via the splitter to the optical fiber, in particular to a receiver, which is connected to the optical fiber.

According to another embodiment, the output of the semiconductor optical amplifier is connected via said splitter and via an attenuator, in particular a variable attenuator, to the optical fiber.

In yet another embodiment, the semiconductor optical amplifier is at least temporarily operated in a saturation mode.

The semiconductor optical amplifier can be operated in its saturation mode in order to obtain an efficient phase modulated signal based on the amplitude modulated signal fed to this semiconductor optical amplifier.

The problem is also solved by a transmitter comprising at least one optical network component as described herein.

The problem mentioned above is further solved by a method for processing data in an optical network,
 wherein an amplitude modulated signal is conveyed to an output of a semiconductor optical amplifier;

wherein a light beam is conveyed to an input of the semiconductor optical amplifier, wherein the semiconductor optical amplifier converts the amplitude modulated signal to a phase modulated signal and provides the phase modulated signal at its output.

It is noted that the input and the output of the semiconductor optical amplifier can also be regarded as a first port and a second port.

According to an embodiment, the amplitude modulated signal is conveyed via a circulator to the semiconductor optical amplifier.

Pursuant to an alternative embodiment, the amplitude modulated signal is conveyed via a splitter to the semiconductor optical amplifier.

It is also an embodiment that the semiconductor optical amplifier is operated in a saturation mode.

In the saturation mode, the semiconductor optical amplifier operates at its maximum level of amplification.

Furthermore, the problem stated above is solved by a communication system comprising at least one device as described herein.

The solution provided in particular suggests two arrangements with (at least) one laser source avoiding residual amplitude modulation. Also, the approach does not require a chirp-free modulator.

Figure 1:
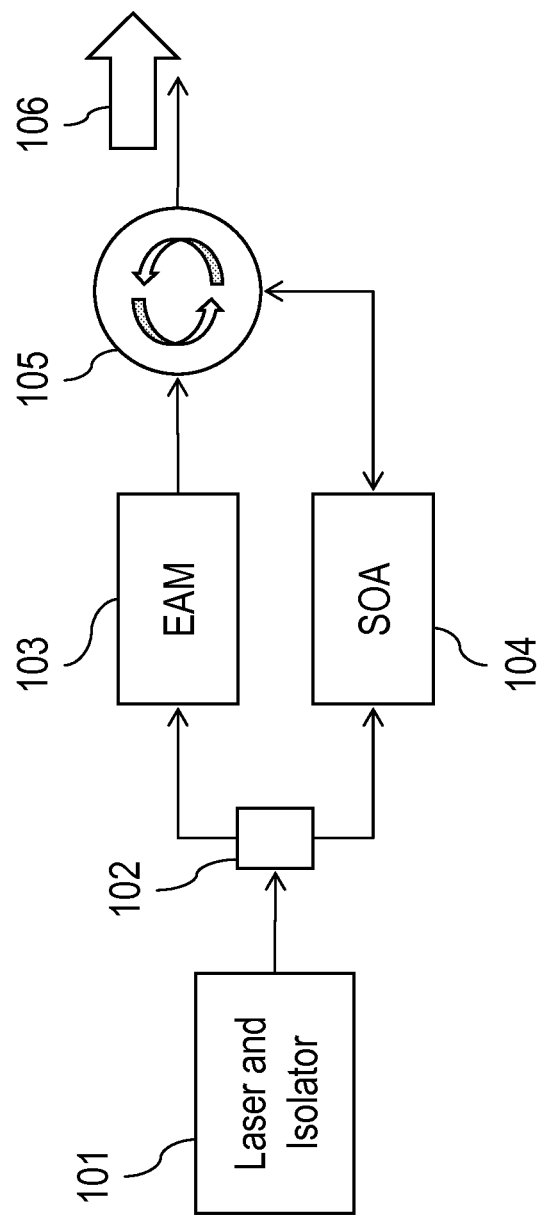
FIG. 1 shows a schematic diagram of an optical transmitter with a semiconductor optical amplifier converting an amplitude modulated signal into a phase modulated signal and providing a reduced level of the amplitude modulated signal at its output.

FIG. 1 shows a schematic diagram of an optical transmitter. A laser (preferably with an isolator) 101 conveys a light beam via a power splitter 102 to an electro absorption modulator EAM 103 and to a semiconductor optical amplifier SOA 104. The EAM 103 modulates the light beam with an electrical signal (amplitude modulation) and conveys the modulated signal to a circulator 105. The circulator 105 conveys this amplitude modulated signal to the SOA 104. As the light beam is also conveyed from the power splitter 102 to the SOA 104, both light signals arriving at the SOA 104 result in a phase modulated signal, wherein the amplitude modulated signal is suppressed based on the SOA's self phase modulation (SPM). It is noted that the SOA 104 preferably operates in a saturation mode. The phase modulated signal without a (significant) amplitude modulated portion is conveyed from the SOA 104 to the circulator 105 and from there across an optical fiber (indicated by an arrow 106) to a receiver (not shown in FIG. 1).

The amplitude modulated signal is suppressed by a "counter propagating wave" Kerr effect, wherein the AM modulated light beam originates at the same laser source 101 as does the phase modulated output signal.

This solution has the advantage of a cost efficient setup that may utilize commonly available components (no expensive special equipment is required). A chirp of the modulator (EAM 103) is negligible. The phase modulated output signal provided by such transmitter has no or only a minimum residual amplitude modulated portion. It is also an advantage that compared to cross phase modulation (XPM) solutions, only a single light source (instead of two light sources) is required. The SOA 104 provides two different functionalities, i.e. an optical amplification and the conversion from amplitude to phase modulation.

Figure 2:
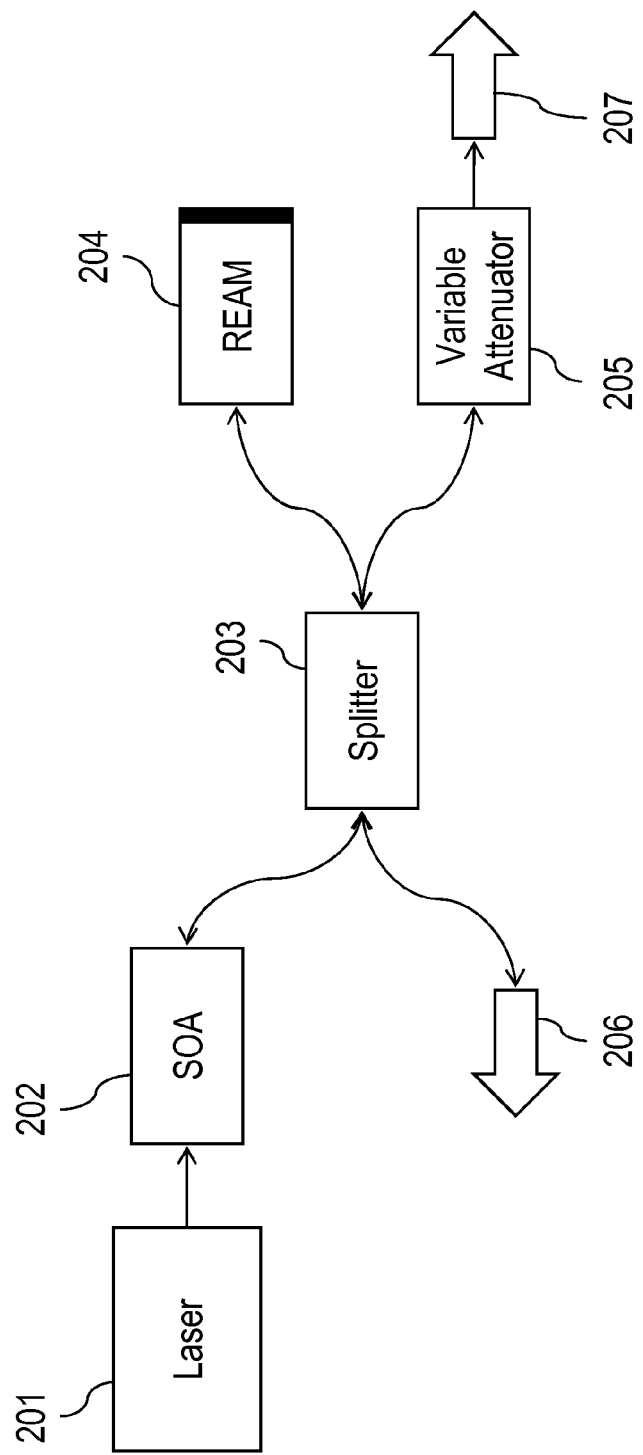
FIG. 2 shows an alternative embodiment of the transmitter according to FIG. 1.

FIG. 2 shows an alternative embodiment with a light source (laser 201) conveying a light beam to a SOA 202 which further is connected to a 2×2 power splitter 203. The splitter 203 is further connected to a reflective electro absorption modulator REAM 204 and to a variable attenuator 205.

The SOA 202 conveys the phase modulated signal via the splitter 203 to the REAM 204 where it is amplitude modulated with an electrical signal. The amplitude (and phase) modulated signal is then fed back to the splitter 203 and to the SOA 202. This amplitude and phase modulated signal can also be monitored at the other port of the splitter 203, indicated by an arrow 206. The SOA 202 obtaining the signal from the splitter 203 converts the amplitude modulation to a phase modulation and suppresses (or at least reduces) the amplitude modulation portion. The resulting (mainly) phase modulated signal is then fed via the splitter 203 to the variable attenuator 205 (optional) and conveyed (indicated by an arrow 207) via an optical fiber to a receiver (not shown in FIG. 2).

In addition to the advantages stated above with regard to FIG. 1, this solution shown in FIG. 2 is very cost-efficient, because no circulator is required and of the efficient implementation of the REAM 204. In addition, the SOA 202 can be used as an amplifier for the amplitude modulated signal, which reduces the laser power requirement and/or the modulation index of the REAM 204.

In the embodiments of FIG. 1 and FIG. 2, a fraction of the emitted light is reflected backwards to the light source (laser, e.g., laser diode). In order to avoid disturbance of the light source by back-scattering especially in terms of spectral properties, the light source may contain an optical isolator. Instead of an optical isolator a combination of polarizer and a quarter wave plate can be used as described, e.g., in US 2002/0118904 A1.

LIST OF ABBREVIATIONS

AM amplitude modulation
EAM electro absorption modulator
PM phase modulation
REAM reflective electro absorption modulator
SOA semiconductor optical amplifier
XPM cross phase modulation
SPM self phase modulation

LIST OF REFERENCES 101 laser (with an optional isolator); also: light source
102 splitter, in particular power splitter
103 EAM
104 SOA
105 circulator
106 output signal (to be conveyed via optical fiber)
201 laser (with an optional isolator); also: light source
202 SOA
203 splitter
204 REAM
205 variable attenuator (optional)
206 monitoring signal (comprising AM and PM portions)
207 output signal (to be conveyed via optical fiber)

The invention claimed is:
1. An optical network component comprising:
a semiconductor optical amplifier with an input and an output,
wherein the input is connected to a light source, wherein the output is connected to an amplitude modulator, wherein the semiconductor optical amplifier converts an amplitude modulated signal from the amplitude modulator to a phase modulated signal and provides the phase modulated signal at its output, wherein the light source is connected via a splitter to the input of the semiconductor optical amplifier and to the amplitude modulator, wherein an output of the amplitude modulator is connected via a circulator to the output of the semiconductor optical amplifier, and wherein the output of the semiconductor optical amplifier is connected to an optical fiber via said circulator.

2. The optical network component according to claim 1, wherein the optical network component comprises the light source.

3. The optical network component according to claim 1, wherein the light source comprises a laser, in particular at least one laser diode.

4. The optical network component according to claim 3, wherein the light source comprises an isolator.

5. The optical network component according to claim 1, wherein the optical network component comprises the amplitude modulator.

6. The optical network component according to claim 1, wherein the amplitude modulator is an electro absorption modulator.

7. The optical network component according to claim 1, wherein the semiconductor optical amplifier is at least temporarily operated in a saturation mode.

8. A transmitter comprising at least one optical network component according to claim 1.

9. A method for processing data in an optical network comprising:
conveying an amplitude modulated signal to an output of a semiconductor optical amplifier;
conveying a light beam to an input of the semiconductor optical amplifier; and
with the semiconductor optical amplifier, converting the amplitude modulated signal to a phase modulated signal and providing the phase modulated signal at the output of the semiconductor optical amplifier,
wherein the amplitude modulated signal is conveyed via a circulator to the semiconductor optical amplifier; and
wherein the light beam is conveyed via a splitter to the input of the semiconductor optical amplifier and to the amplitude modulator.

10. The method according to claim 9, wherein the semiconductor optical amplifier is operated in a saturation mode.

11. An optical network component comprising:
a semiconductor optical amplifier with an input and an output,
wherein the input is connected to a light source and the output is connected to an amplitude modulator,
wherein the semiconductor optical amplifier converts an amplitude modulated signal from the amplitude modulator to a phase modulated signal and provides the phase modulated signal at its output;
wherein the output of the semiconductor optical amplifier is connected via a splitter to the amplitude modulator; and
wherein the output of the semiconductor optical amplifier is connected via said splitter to an optical fiber.

12. The optical network component according to claim 11, wherein the optical network component comprises the light source.

13. The optical network component according to claim 11, wherein the light source comprises a laser, in particular at least one laser diode.

14. The optical network component according to claim 13, wherein the light source comprises an isolator.

15. The optical network component according to claim 11, wherein the optical network component comprises the amplitude modulator.

16. The optical network component according to claim 11, wherein the amplitude modulator is an electro absorption modulator, in particular a reflective electro absorption modulator.

17. The optical network component according to claim 11, wherein the output of the semiconductor optical amplifier is connected via said splitter and via an attenuator, in particular a variable attenuator, to the optical fiber.

18. The optical network component according to claim 11, wherein the semiconductor optical amplifier is at least temporarily operated in a saturation mode.

19. A transmitter comprising at least one optical network component according to claim 11.

20. A method for processing data in an optical network, comprising:
conveying an amplitude modulated signal to an output of a semiconductor optical amplifier;
conveying a light beam to an input of the semiconductor optical amplifier; and
with the semiconductor optical amplifier, converting the amplitude modulated signal to a phase modulated signal and providing the phase modulated signal at the output of the semiconductor optical amplifier;
wherein the amplitude modulated signal is conveyed via a splitter to the semiconductor optical amplifier.

21. The method according to claim 20, wherein the semiconductor optical amplifier is operated in a saturation mode.

* * * * *